United States Patent
Sultenfuss et al.

(10) Patent No.: US 10,303,227 B2
(45) Date of Patent: May 28, 2019

(54) INFORMATION HANDLING SYSTEM HOUSING HEAT SPREADER

(71) Applicant: Dell Products L.P., Round Rock, TX (US)

(72) Inventors: Andrew T. Sultenfuss, Leander, TX (US); Travis C. North, Pflugerville, TX (US); Deeder M. Aurongzeb, Round Rock, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 752 days.

(21) Appl. No.: 13/779,598

(22) Filed: Feb. 27, 2013

(65) Prior Publication Data

US 2014/0240921 A1 Aug. 28, 2014

(51) Int. Cl.
*G06F 1/20* (2006.01)
*G06F 1/16* (2006.01)

(52) U.S. Cl.
CPC .............. *G06F 1/20* (2013.01); *G06F 1/1656* (2013.01); *Y10T 29/49002* (2015.01)

(58) Field of Classification Search
CPC ...................................................... G06F 1/206
USPC .................. 361/679.46–679.54, 688–723
See application file for complete search history.

(56) References Cited

U.S. PATENT DOCUMENTS

| | | | |
|---|---|---|---|
| 5,831,374 A * | 11/1998 | Morita et al. ................ 313/46 |
| 6,058,012 A * | 5/2000 | Cooper et al. ............... 361/704 |
| 6,498,731 B1 * | 12/2002 | Roscoe et al. ............... 361/796 |
| 6,784,363 B2 * | 8/2004 | Jones ................. H05K 9/0015 174/351 |
| 7,342,793 B2 * | 3/2008 | Ristic-Lehmann et al. .. 361/708 |
| 7,385,819 B1 * | 6/2008 | Shives et al. ................ 361/704 |
| 7,534,650 B2 * | 5/2009 | Houle et al. ................. 438/106 |
| 7,535,174 B2 * | 5/2009 | Shin ............................ 313/582 |
| 7,649,737 B2 * | 1/2010 | Matsuzawa et al. .... 361/679.54 |
| 8,363,407 B2 * | 1/2013 | Yamamoto et al. ......... 361/705 |
| 8,587,945 B1 * | 11/2013 | Hartmann et al. ........... 361/708 |
| 2003/0003289 A1 * | 1/2003 | Py et al. .................... 428/304.4 |
| 2003/0043541 A1 * | 3/2003 | Yuasa et al. ................. 361/687 |
| 2004/0097635 A1 * | 5/2004 | Fan et al. .................... 524/496 |
| 2004/0119410 A1 * | 6/2004 | Jun et al. ..................... 313/582 |
| 2005/0068738 A1 * | 3/2005 | Kim et al. ................... 361/704 |
| 2005/0078446 A1 * | 4/2005 | Bae ............................. 361/687 |
| 2005/0168941 A1 * | 8/2005 | Sokol et al. ................. 361/688 |
| 2005/0274608 A1 * | 12/2005 | Ko ............................ 204/230.2 |
| 2006/0056157 A1 * | 3/2006 | Ford et al. ................... 361/704 |
| 2006/0067055 A1 * | 3/2006 | Heffner et al. .............. 361/704 |
| 2006/0077619 A1 * | 4/2006 | Kim et al. ................... 361/679 |
| 2006/0098413 A1 * | 5/2006 | Capp et al. .................. 361/705 |

(Continued)

*Primary Examiner* — David M Sinclair
*Assistant Examiner* — Robert D Brown
(74) *Attorney, Agent, or Firm* — Zagorin Cave LLP; Robert W. Holland

(57) ABSTRACT

Thermal energy exposed at the outer surface of an information handling system housing is managed by spreading the thermal energy across the housing X and Y axes while restricting heat transfer from the housing at the Z axis. For example, a graphene outer surface couples to an aerogel substrate strengthened by a carbon fiber laminate. The graphene spreads thermal energy that escapes through the housing across the housing outer surface to limit the impact of thermal energy at any particular location, such as proximate to the location of a processor.

16 Claims, 2 Drawing Sheets

(56) References Cited

U.S. PATENT DOCUMENTS

| | | | |
|---|---|---|---|
| 2006/0110608 A1* | 5/2006 | Azumi et al. | 428/441 |
| 2006/0126310 A1* | 6/2006 | Watanabe | 361/720 |
| 2006/0133046 A1* | 6/2006 | Kim et al. | 361/714 |
| 2006/0171124 A1* | 8/2006 | Capp et al. | 361/705 |
| 2006/0187641 A1* | 8/2006 | Shin | 361/704 |
| 2006/0273446 A1* | 12/2006 | Sato et al. | 257/700 |
| 2007/0153458 A1* | 7/2007 | Okimoto et al. | 361/681 |
| 2007/0158050 A1* | 7/2007 | Norley et al. | 165/80.4 |
| 2007/0230132 A1* | 10/2007 | Lee | 361/707 |
| 2008/0174147 A1* | 7/2008 | Skaradzinski | B62D 33/048 296/181.3 |
| 2008/0192435 A1* | 8/2008 | Yamamiya | 361/703 |
| 2008/0266787 A1* | 10/2008 | Gosset et al. | 361/689 |
| 2008/0296756 A1* | 12/2008 | Koch et al. | 257/713 |
| 2009/0014864 A1* | 1/2009 | Yao et al. | 257/706 |
| 2009/0213550 A1* | 8/2009 | Hongo | 361/704 |
| 2010/0014256 A1* | 1/2010 | Lee | 361/721 |
| 2010/0033933 A1* | 2/2010 | Hashimoto et al. | 361/700 |
| 2010/0039777 A1* | 2/2010 | Houle et al. | 361/718 |
| 2010/0053899 A1* | 3/2010 | Hashimoto et al. | 361/701 |
| 2010/0079955 A1* | 4/2010 | Li et al. | 361/703 |
| 2010/0128439 A1* | 5/2010 | Tilak et al. | 361/709 |
| 2010/0194179 A1* | 8/2010 | Waltz | B60T 5/00 301/6.91 |
| 2010/0226701 A1* | 9/2010 | Moorlag | 399/333 |
| 2011/0032678 A1* | 2/2011 | Altman | H01L 23/373 361/709 |
| 2011/0242764 A1* | 10/2011 | Hill et al. | 361/705 |
| 2012/0048528 A1* | 3/2012 | Bergin | H01L 23/3733 165/185 |
| 2012/0188287 A1* | 7/2012 | Wurzel et al. | 345/690 |
| 2012/0268895 A1* | 10/2012 | Morelle et al. | 361/715 |
| 2012/0297813 A1* | 11/2012 | Hanley | F25D 23/064 62/331 |
| 2013/0003932 A1* | 1/2013 | Nishino | 378/91 |
| 2013/0050945 A1* | 2/2013 | Diep et al. | 361/704 |
| 2013/0083491 A1* | 4/2013 | Rappoport et al. | 361/722 |
| 2013/0128462 A1* | 5/2013 | Zadesky et al. | 361/705 |
| 2013/0148302 A1* | 6/2013 | Ben Jamaa et al. | 361/704 |
| 2013/0329366 A1* | 12/2013 | Wang et al. | 361/704 |
| 2014/0022733 A1* | 1/2014 | Lim et al. | 361/718 |

* cited by examiner

INFORMATION HANDLING SYSTEM HOUSING HEAT SPREADER

BACKGROUND OF THE INVENTION

Field of the Invention

The present invention relates in general to the field of information handling system housings, and more particularly to an information handling system housing heat spreader.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems are built in housings designed to have minimal footprint. Tablet information handling systems are one type of portable information handling system in which a planar housing integrates a touch screen that acts as the primary input/output (I/O) device. Relatively small tablets provide convenient reading devices and handle simple tasks on-the-go, such as web browsing and e-mail. Smartphones are an example of a small tablet that also provides mobile telephone communications. Portable information handling systems that handle more intensive computing operations, such as word processing, graphics design, spread sheet analysis, etc. . . . , typically have a housing with an integrated keyboard and a greater size that allows room to contain more powerful processing components. Generally, as processing capability increases housing size for containing processing components also tends to increase. Users generally weigh convenience associated with smaller housings against processing capabilities associated with larger housings when selecting an information handling system.

One constraint on the use of powerful components in a housing is the amount of heat that the components generate as a byproduct of electrical power consumption. Central processing units (CPUs) provide an example of this since greater processing speeds tend to consume greater power and, as a result, release greater amounts of heat as a byproduct. Heat generated by a CPU can cause failure of an information handling system due to excessive internal temperatures unless the heat escapes the housing. In addition, heat concentrated around the location of a CPU or other heat-generating component can cause discomfort to end users who touch the housing near the position of the CPU. One reason for the use of a larger housing with more powerful components is that a larger housing generally allows the use of active heat dissipation to remove heat from within the housing. A common active heat dissipation system is an internal cooling fan that blows a cooling airflow over heated components to help remove thermal energy. Passive heat dissipation, such as heat pipes and heat sinks, generally does not transfer thermal energy out of a housing as effectively as active heat dissipation. Thus, information handling system designers often face difficult constraints when attempting to build portable information handling systems that provide adequate management of excess thermal energy. Thin form factor information handling systems that lack adequate room for active heat dissipation systems, such as cooling fans, tend to have CPUs and other processing components with less robust processing capabilities so that internal and external housing temperatures will not exceed safe limits.

SUMMARY OF THE INVENTION

Therefore a need has arisen for a system and method which supports spreading of thermal energy across an information handling system housing external surface to limit concentrations of thermal energy, such as heat spots proximate the location of a CPU disposed in the housing.

In accordance with the present invention, a system and method are provided which substantially reduce the disadvantages and problems associated with previous methods and systems for dissipating heat in a passive manner at an information handling system's or other electronic device's housing. A heat-spreading outer surface spreads thermal energy across the outer surface of the information handling system while limiting transfer of thermal energy outwards from the housing. The heat-spreading outer surface reduces concentrations of thermal energy in hot spots that might cause discomfort to an end user and reduces thermal transfer out from the housing for reduce impact on an end user when higher temperatures do exist.

More specifically, an electronic device housing supports electronic components that generate heat as a byproduct of electric power consumption. For example, an information handling system housing having a tablet form factor supports processing components that cooperate to process information, such as CPU and memory. Excess thermal energy generated by the processing components has a restricted impact on end user interactions with the housing. As this excess thermal energy is transported to the surface of the housing via thermal conduction, to manage and minimize the hot spot an innovative approach to manage the energy transfer has been created to minimize the through plane conductivity and maximize the surface cooling area. For example, a silicon or carbon based aerogel is laminated with a supporting material, such as carbon fiber, to insulate thermal energy generated within the housing from escaping to the housing outer surface. A graphene outer surface layer is laminated to the supporting material or the insulating material so that thermal energy escaping to the housing outer surface is spread across the outer surface to avoid the presence of hot spots, such as concentrations of thermal energy proximate the location of a processor or other relatively high thermal energy source. The graphene outer surface layer couples to substrate housing material with an adhesive or as an integrated layer using a lamination, such as polyurethane and a heated press.

The present invention provides a number of important technical advantages. One example of an important technical advantage is that a light weight carbon fiber housing suitable for use in thin form factor information handling systems passively dissipates heat along an outer surface of the housing to prevent thermal hot spots, such as may occur near the location of a CPU. A graphene layer located at the outer surface conducts thermal energy in X and Y axes parallel to the outer surface while having limited thermal energy conduction out a Z axis perpendicular to the outer surface. Limited thermal energy conduction out the Z axis reduces the impact of heat spots located along the outer surface, such as proximate the location of a CPU. Rapid and efficient thermal dissipation along the X and Y axes reduces the concentration of thermal energy at any particular location, instead spreading the thermal energy along the surface to provide lower peak temperatures at locations having concentrated thermal energy, such as proximate a CPU disposed in the interior of the housing.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An electronic device, such as an information handling system, has a housing with a heat-spreading outer surface that minimizes the impact of hot spots on an end user interacting with the housing. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
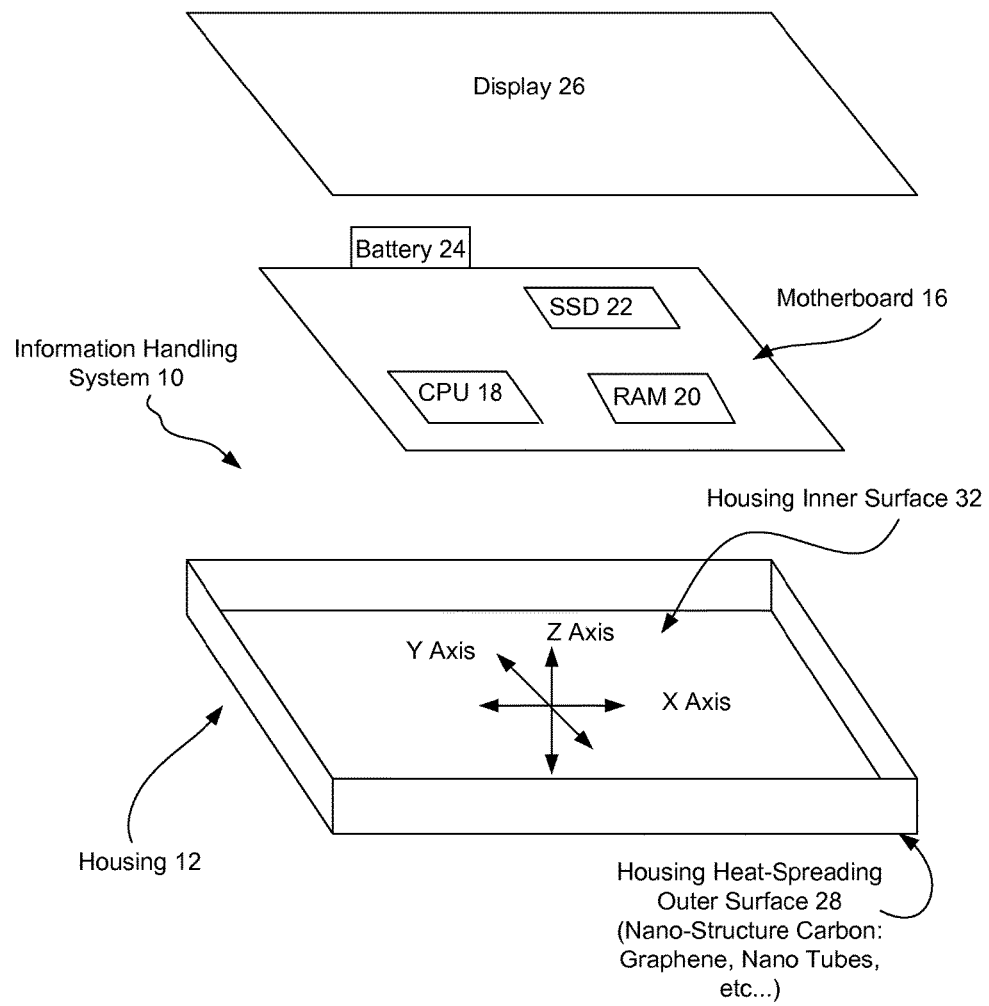
FIG. 1 depicts a blow-up view of a portable information handling system having a tablet form factor in a housing with a heat-spreading outer surface.

Referring now to FIG. 1, a blow-up view depicts a portable information handling system 10 having a tablet form factor in a housing 12 with a heat-spreading outer surface. Information handling system 10 processes information with processing components disposed in housing 12. For example, a motherboard 16 supports a CPU 18 and RAM 20 within housing 12 and provides communication between CPU 18 and RAM 20 to store and execute instructions. Persistent storage of information is provided by a solid state drive 22 and power to run the processing components is provided by an integrated battery 24. A touchscreen display 26 encloses components disposed in housing 12 and also provides an interface for end users to view information as images and input information as touches. In the example embodiment depicted by FIG. 1, temperatures within housing 12 are managed by passive thermal dissipation. In alternative embodiments, alternative form factors for housing 12 and active thermal dissipation may be used, such as a clamshell laptop form factor that includes a cooling fan, a convertible tablet form factor or a desktop form factor.

Housing 12 includes a heat spreading outer surface 28 that readily conducts thermal energy parallel to the surface in X and Y axes but has limited conduction of thermal energy perpendicular to the surface in a Z axis. For example, heat spreading outer surface 28 is graphene or other nanostructure carbon materials with limited Z axis thermal conductivity, such as carbon nanotubes. Heat-spreading outer surface 28 reduces the risk of end user discomfort due to hot spots of concentrated thermal energy located at the outer surface of housing 12. For example, CPU 18 typically produces more excess thermal energy than other components and the thermal energy can pass through housing 12 to concentrate in the area of the housing outer surface that is proximate CPU 18. A graphene outer surface 28 spreads the thermal energy across the surface of housing 12 so that heat does not concentrate in any particular location, such as proximate the position of CPU 18. A graphene outer surface 28 also reduces the impact of thermal energy on an end user by having limited thermal conductivity out of the housing in a Z axis towards an end user's skin. For example, graphene thermal conductivity in the X and Y axes is approximately 300 W/mk versus less than 0.2 W/mk in the Z axis. In one embodiment, a graphene outer surface 28 is used over only a portion of housing 12 as needed where hot spots tend to form, such as proximate CPU 18.

Figure 2:
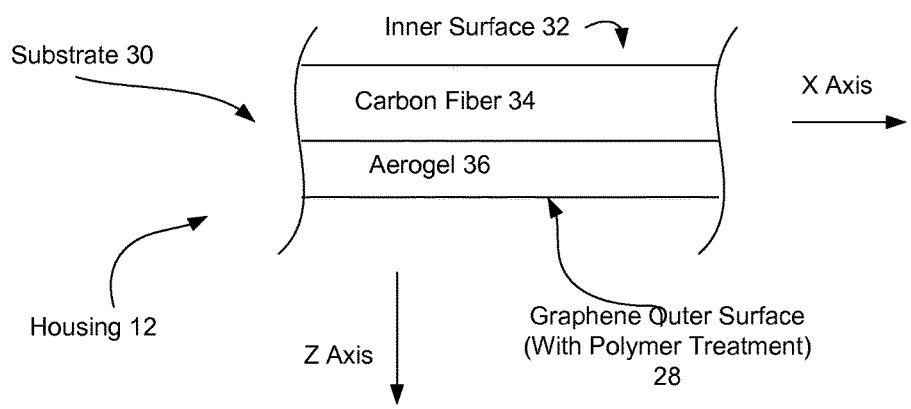
FIG. 2 depicts a side cutaway view of a housing material having a heat-spreading outer surface.

Referring now to FIG. 2, a side cutaway view depicts a housing material having a heat-spreading outer surface 28. Housing 12 has a substrate 30 of one or more materials that support a graphene outer surface 28 exposed at the exterior of housing 12. In the example embodiment, the inner surface 32 of housing 12 is formed with a carbon fiber laminate material layer 34 having a thickness of substantially 0.8 mm that provides structural soundness. In alternative embodiments, carbon fiber thickness may vary from between 0.1 mm and 2 mm, and the aerogel thickness may vary from between 0.3 mm and 2 mm. A silica aerogel layer 36 couples with carbon fiber laminate layer 34 towards the inner surface 32 of housing 12 and to graphene outer surface 28 towards the exterior of housing 12. Silica aerogel is a silicon based material with light weight and poor thermal conductivity, which reduces conduction of heat from inner surface 32 to outer surface 28. Silica aerogel is structurally a relatively weak material so that the carbon fiber laminate material provides structural strength while the aerogel provides thermal insulation. In one embodiment, graphene outer surface 28 couples to silica aerogel layer 36 with an adhesive that adds approximately 0.2 mm of thickness to the material. As an alternative, silica aerogel and graphene are coupled with a polyurethane and/or other types of stiff adhesive bonding agents using a laminate press at 200 degrees Celsius to obtain bonding so that graphene outer layer 28 effectively adds no thickness to housing 12. Infrared gun treatment after assembly of substrate 30 aids in bonding of the material layers. In one alternative embodiment, silica aerogel is sandwiched between layers of carbon fiber or other materials that couple to graphene outer surface 28 instead of the aerogel. In other alternative embodiments, insulating materials other than aerogel may be used. As depicted in FIG. 2 and other embodiments, the graphene outer surface may only provide a portion of a housing outer surface with other parts of the housing made from ceramic, composite, plastic, carbon fiber, aluminum, magnesium or other materials that abut against or overlap some or all of the graphene outer surface. Generally, graphene and similar materials may flake off the outer surface if coupled to the outer surface untreated, so the graphene outer surface may include various polymer treatments to ensure its stability.

Figure 3:
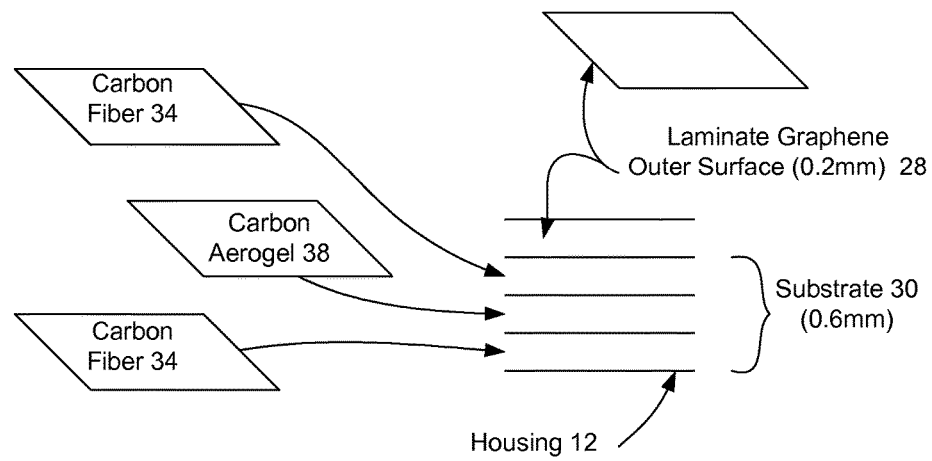
FIG. 3 depicts a flow diagram of a process for assembly of a housing for an electronic device having a heat-spreading outer surface.

Referring now to FIG. 3, a flow diagram depicts a process for assembly of a housing 12 for an electronic device having a heat-spreading outer surface 28. The example embodiment depicted by FIG. 3 uses carbon aerogel instead of a silicon aerogel in order to obtain a thinner substrate 30. Carbon aerogel is substantially 20% stronger and 80% smaller than silica aerogel and has similar thermal insulating properties. In the example embodiment depicted by FIG. 3, first and second carbon fiber layers 34 sandwich one or more carbon aerogel layers 38 to form substrate 30. Carbon fiber layers 34 couple to the carbon aerogel layer 38 using a pre-preg process with application of heat and pressure to form a contiguous material, such as a polycarbonate based pre-preg process and pressing at 200 degrees Celsius. In the example embodiment, first and second layers of carbon fiber sandwich a polymer carbon aerogel layer 38 to form material of substantially 0.6 mm thickness. A laminate of graphene 28 couples to a carbon fiber layer 34 to form an outer housing surface, such as with an adhesive that adds 0.2 mm of thickness. In alternative embodiments, graphene outer surface layer 28 may couple to a different material of substrate 30, such as another layer of aerogel material. A total housing thickness of substantially 0.8 mm is achieved in the example embodiment depicted by FIG. 3 where adhesive coupling of graphene outer surface layer 28 adds substantially 0.2 mm. By comparison, use of a silica aerogel would result in a housing thickness of substantially 1.2 mm.

Figure 4:
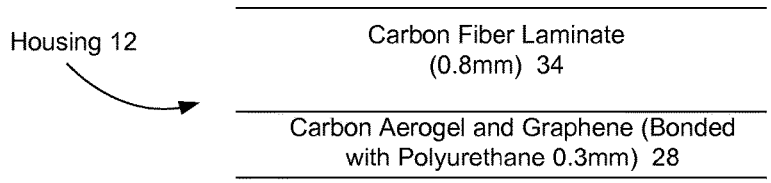
FIG. 4 depicts a side cutaway view of a housing material having a heat-spreading outer surface.

Referring now to FIG. 4, a side cutaway view depicts a housing material having a heat-spreading outer surface 28. In the example embodiment depicted by FIG. 4, a single carbon fiber layer 34 supports a single carbon aerogel layer 38, which couples to a graphene outer surface 28. Carbon fiber layer 34 is a laminate having a thickness of substantially 0.8 mm to provide structural support for housing 12. Carbon aerogel and graphene layers 38 and 28 have a combined thickness of substantially 0.3 mm to insulate thermal energy from passing to the housing exterior and to spread thermal energy that does pass to outer surface 28 so that hot spots do not form. Carbon aerogel layer 38 and graphene layer 28 couple together with polyurethane so that an adhesive is not needed with the additional thickness associated with adhesive use. Substrate 30 is laminated using a press at 200 degrees Celsius and post press treatment with an IR gun for additional bonding. In alternative embodiments, alternative substrate materials may be used to provide structural support and insulation, and alternative heat spreading materials may be used on the outer housing that spread heat in X and Y axes while limiting thermal transfer in a Z axis. The amount of insulation and the extent of heating spreading material may be altered to achieve desired housing characteristics.

Although the present invention has been described in detail, it should be understood that various changes, substitutions and alterations can be made hereto without departing from the spirit and scope of the invention as defined by the appended claims.

What is claimed is:

1. An information handling system comprising:
    a housing sized to contain processing components for processing information, at least a portion of the housing having a graphene outer surface coupled to a substrate material, the substrate having inner and outer layers of carbon fiber with an insulative aerogel layer disposed between the inner and outer layers of carbon fiber; and
    processing components disposed in the housing and operable to process information, the processing components generating thermal energy, the graphene spreading the thermal energy at the outer surface.

2. The information handling system of claim 1 wherein the aerogel is a silicon aerogel.

3. The information handling system of claim 1 wherein the aerogel is a carbon aerogel.

4. The information handling system of claim 3 further comprising a carbon aerogel layer disposed between the substrate and the graphene, the graphene coupling to the carbon aerogel with polyurethane or additional stiff adhesive bonding agent.

5. The information handling system of claim 4 wherein the substrate comprises a thickness of between 0.1 mm and 2 mm, and the carbon aerogel and graphene have a thickness of between 0.3 mm and 2 mm.

6. The information handling system of claim 1 wherein the housing has a planar tablet form factor.

7. The information handling system of claim 6 wherein the processing components comprise a processor and the at least a portion is proximate to the processor.

8. The information handling system of claim 7 wherein the graphene layer is disposed at only a portion of the housing proximate to the processor.

9. An information handling system comprising:
    a housing sized to contain processing components for processing information, at least a portion of the housing consisting of a graphene outer surface coupled to a substrate material, the substrate having inner and outer layers of carbon fiber with an insulative aerogel layer disposed between the inner and outer layers of carbon fiber; and
    processing components disposed in the housing and operable to process information, the processing components generating thermal energy, the graphene spreading the thermal energy at the outer surface.

10. The information handling system of claim 9 wherein the aerogel is a silicon aerogel.

11. The information handling system of claim 9 wherein the aerogel is a carbon aerogel.

12. The information handling system of claim 11 further comprising a carbon aerogel layer disposed between the substrate and the graphene, the graphene coupling to the carbon aerogel with polyurethane or additional stiff adhesive bonding agent.

13. The information handling system of claim 12 wherein the substrate comprises a thickness of between 0.1 mm and 2 mm, and the carbon aerogel and graphene have a thickness of between 0.3 mm and 2 mm.

14. The information handling system of claim 9 wherein the housing has a planar tablet form factor.

15. The information handling system of claim 14 wherein the processing components comprise a processor and the at least a portion is proximate to the processor.

16. The information handling system of claim 15 wherein the graphene layer is disposed at only a portion of the housing proximate to the processor.

* * * * *